(12) United States Patent
Bystrom

(10) Patent No.: US 7,141,960 B2
(45) Date of Patent: Nov. 28, 2006

(54) METHOD AND DEVICE SYSTEM FOR TESTING ELECTRICAL COMPONENTS

(75) Inventor: Lars Mats Jan Bystrom, Göteborg (SE)

(73) Assignee: Sagab Electronic AB, Bollebygd (SE)

( * ) Notice: Subject to any disclaimer, the term of this patent is extended or adjusted under 35 U.S.C. 154(b) by 0 days.

(21) Appl. No.: 11/065,391

(22) Filed: Feb. 24, 2005

(65) Prior Publication Data
US 2005/0142957 A1    Jun. 30, 2005

Related U.S. Application Data

(63) Continuation-in-part of application No. 10/250,182, filed on Jun. 10, 2003, now abandoned.

(51) Int. Cl.
*G01R 19/00* (2006.01)
*G01R 25/08* (2006.01)

(52) U.S. Cl. .................................... 324/66; 324/86

(58) Field of Classification Search ............... 324/66, 324/86, 527, 529, 521, 532, 535; 702/72
See application file for complete search history.

(56) References Cited

U.S. PATENT DOCUMENTS

| | | | | |
|---|---|---|---|---|
| 4,626,622 A | * | 12/1986 | Bouvrette | 379/93.37 |
| 5,414,343 A | * | 5/1995 | Flaherty et al. | 324/66 |
| 5,510,700 A | * | 4/1996 | Pomatto | 324/66 |
| 5,521,491 A | * | 5/1996 | Najam | 324/86 |
| 5,680,040 A | * | 10/1997 | Kawai et al. | 324/86 |

\* cited by examiner

*Primary Examiner*—Anjan Deb
(74) *Attorney, Agent, or Firm*—Rolf Fasth

(57) ABSTRACT

The method is for testing an electrical component. The sender unit 12 may be applied to an electrical plug 24 that has a first line 28, a second line 32 and a ground line 36. It is determined which of the lines 28, 32, 36 that has a voltage potential relative to the surrounding. The phase configuration of the electrical plug 24 may be determined. The unit 14 is applied to a remote electrical unit and the sender sends a synchronization signal 41 to the receiver unit 14 that starts a counter providing a measurement of the time difference between corresponding phase positions of the alternating current of the plug 24 and that of the remote electrical unit. This time difference can then be converted to a phase difference value. The system may also be used to identify a specific fuse that is associated with the plug and for testing ground fault interrupting devices.

11 Claims, 2 Drawing Sheets

METHOD AND DEVICE SYSTEM FOR TESTING ELECTRICAL COMPONENTS

PRIOR APPLICATION

This is a continuation-in-part application of U.S. patent application Ser. No. 10/250,182 filed on 10 Jun. 2003 now abandoned.

FIELD OF INVENTION

The method and device system of the present invention relates to the testing of electrical components such as electrical wires, plugs and fuses.

BACKGROUND OF INVENTION

Electricians and others often need to determine the configuration of electrical plugs and wires in electrical systems such as determining the phase or phases of a plug and the configuration of a fuse box. For example, electricians sometimes need to determine which phases the fuses are associated with and sometimes which particular fuse that is connected to a particular electrical plug. The currently used methods are not only quite cumbersome but also dangerous particularly if it is not possible to turn off the electrical system during the testing procedure. For example, when the electrical system cannot be shut off, some electricians short-circuit the plugs to trigger the fuses to determine which fuse is connected to which plug. This method can create fires and injuries to the electrician. It may also damage the devices that are connected to the electrical system. The currently available testing devices are sensitive to how the testing device is connected to the electrical plug. The voltage phase and/or the reference phase must be in the right place to make the tester show the correct result. The displayed result of the phase configuration often depends on how the testing device is turned when it was plugged in. If the testing device is turned upside down a different result is shown compared to the situation when the upside is turn upwardly. It may not be able to detect the situation when one of the wires carries a current but there is no ground or zero-reference component. It is also difficult to test ground fault devices that are used to detect ground faults to make sure the devices are triggered within a certain permitted time period. Despite many efforts, the currently available devices and methods are not satisfactory. There is a need for a reliable and effective device and method that may be used to accurately and safely determine the configuration of electrical systems while the system is in full operation.

SUMMARY OF INVENTION

The system of the present invention provides a solution to the above-outlined problems. More particularly, the method of the present invention is for testing an electrical component. The sender unit may be applied to an electrical plug that has a first line, a second line and a ground line. It is determined if the first line, the second line or the ground line has a voltage potential relative to the surrounding. The sender unit is connected to a remote receiver unit. The phase configuration of the electrical plug may be determined. The unit is applied to a remote electrical unit and the sender sends a synchronization signal to the receiver unit that starts a counter to determine if the remote electrical unit has a phase that is different from the plug by analyzing alternating voltage of the remote electrical unit. The system may also be used to identify a specific fuse that is associated with the plug and for testing ground fault interrupting devices.

DETAILED DESCRIPTION

Figure 1:
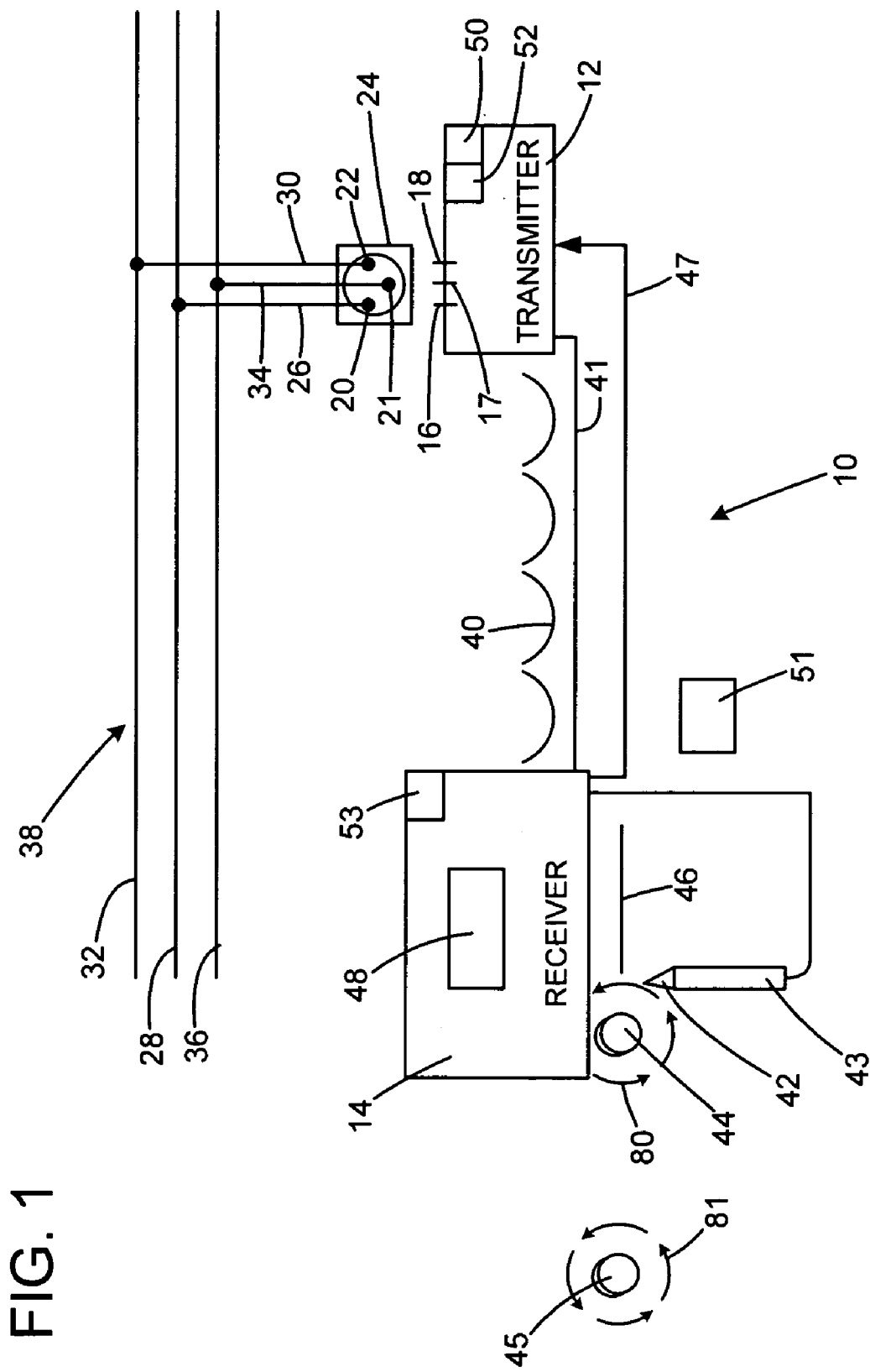
FIG. 1 is a schematic view of the device system of the present invention.

With reference to FIG. 1, the device system 10 has a transmitter unit 12 and a receiver unit 14 that are in communication such as by, for example, radio signals. The sender unit 12 may have protrusions or connectors 16, 17, 18 that fit into openings 20, 21, 22, respectively, of an electrical plug 24. The plug 24 has a first wire 26 connected to a first line 28 and a second wire 30 connected to a second line 32 and a ground wire 34 connected to a ground line 36 of a power supply system 38. An important feature of the system 10 of the present invention is that it is not necessary to turn off the electrical system 38 to fully determine the configuration of and other information about the live plug 24. Preferably, the system 10 is used to test single-phase systems but can also be used for multiple phase systems, if so desired.

In operation, the sender 12 is connected to or plugged into the live plug 24 and turned on. The sender 12 may first determine if there is any voltage present at the connectors of the plug 24 without being in physical contact with the wires and before the microprocessor 52 is activated. At this point, it is not necessary to use the receiver 14. When the sender unit 12 has determined that there is a voltage in at least one of the wires of the plug 24, the microprocessor 52 may be activated to analyze the configuration of the plug 24. The sender 12 may send information signals 40, such as radio signals, to the receiver 14 or if the sender 12 has a processor, start analyzing the configuration of the phase of the plug. If the information is sent to the receiver 14, the receiver 14 receives the signals 40 and uses the information in the signals 40 to determine the status and configuration of the plug 24 by activating a microprocessor 53. The calculations may also be performed in the transmitter unit so that merely the result is sent to the receiver unit.

The processors may be used to calculate and determine the configuration of the plug 24 such as determining which component is the ground, the zero-reference and the voltage component. For example, once it has been determined that there is a voltage potential in the plug 24, the microprocessor 52 analyzes each of the wires 26, 30, 34 connected to the plug 24 and determines the configuration of the wires. If the initial analysis indicates that there is a voltage in the wire 30, the processor 52 may start the analysis based on this information. The processor 52 may check that there is a proper voltage potential between the wire 30 and the wire 26 and between the wire 30 and the ground 34. If there is no resulting voltage difference, the plug 24 may lack a zero-reference wire 26 and/or a ground 34. It may also test the ground 34 and the wire 26 to make sure there is no unacceptable resistance therebetween by applying a small current therebetween and test the resulting voltage.

It is important to test all three components and not just a pair in case the plug has no zero-reference component or ground. By measuring only two components, the user can only determine that there is a voltage difference but not whether the plug lacks the ground or zero-reference component and other vital information. For example, the plug may carry two phases but the ground and/or the zero-reference component is not properly connected.

As indicated earlier, the sender 12 may send the information signal 40 to the receiver 14. Upon receipt of the signal 40 from the sender, the result may be displayed in the display 48 of the receiver 14. For example, the signal 40 may include information about the voltage and/or frequency. The shape of the signal may also be continuously displayed. Of course, the display 48 may be disposed on the sender 12 also. As discussed below, the sender 12 may continuously send a synchronization pulse 41 to the receiver 14 that the receiver 14 may use to analyze the relationship between the plug 24 and remotely located wires, plugs and fuses.

As indicated above, the system 10 may also be used to determine phase configurations. The sender 12 sends the synchronization signals 41 to the receiver 14 when the wave curve of the alternating voltage is, for example, at the peak. The receiver 14 receives the signals 41 and starts a time counter as the probe 43 of the receiver 14 is applied to a remote wire or fuse to be investigated. In this way, the peak values of the wave curve of the remote wire and the position of the peak values of the plug 24 contained in the signals 41 are compared to determine if the voltage of the remote wire is in the same phase as the voltage of the plug 24. Depending upon how long the counter has counted, i.e. the time, until it receives the peak value from the remote wire, it can be determined what the phase relationship is between the remote wire and the reference wire at the sender 12. If the phase of the remote wire is 120 degrees ahead or behind the alternating voltage of the plug 24, information about the phase relationship between the two voltages is displayed in the display 48. The system 10 may also be used to determine if the three phases of a three-phase plug exist and that they are correctly connected so that there is 120 degrees difference between the three phases and that the order is correct.

It is possible to determine if the remote wire, a single fuse or a group of fuses belong to the same phase as the plug 24. The fuses in an electrical box are sometimes split up evenly between the three phases so that about ⅔ of all the fuses may belong to one of the other two phases. The system 10 may be used to determine and make sure that all the phases of the entire electrical system correctly reach the fuse box so that the correct fuses are connected to the right phases.

A third important function of the system 10 is to determine which particular electrical component, for example a fuse, ciruit breaker or wire, disposed in a remote site or part of the installation, is connected to the plug 24. If the electrical component is a fuse or circuit breaker, the proper connection can be tested without having to disengage the component. It is also possible to determine, with the help of the phase finding feature of the receiver 14, which plugs are connected to the same component to ensure it is safe to disengage the particular component without damaging other equipment connected to the same circuit or phase.

More particularly, the sender 12 at the plug 24 generates a small alternating current. This current may be modulated at a very high frequency that is easy for the receiver 14 to identify. Preferably, the frequency should be very different from 50–60 Hz or near multiples thereof because those frequencies are often used for conventional alternating current. Typically, a frequency of 1–100 kHz or any other suitable frequency may be used. The receiver 14 at the component 44 detects a magnetic field 80 that are created as a result of the small current. The magnetic field, as opposed to the electric field or voltage variations, may not spread to other components because only the component that carries the particular current will generate the magnetic field. A component 45 may be surrounded by a different magnetic field 81. In general, the sender 12 may also send out an identification signal so that the receiver 14 can distinguish the signals from the sender 12 from other senders that may be in operation in the vicinity. The use of the identification signal may be used for all the applications of the system.

In practice, the receiver 14 has the sensor 42 disposed in a testing probe 43 that may be held close to an electrical component such as a fuse 44 or a wire 46 to determine if the plug 24 is connected to the fuse 44 or if the plug 24 is connected to the same phase as the wire 46 or if the phase of the wire 46 is 120 degrees ahead or behind the phase of the plug 24. The receiver 14 has the display 48 that indicates the correct fuse or wire and shows the voltage and frequency of the plug 24 at the time of the testing. By using radio communication, the user may determine if the voltage in the plug 24 is present although a fuse 44 or circuit breaker has been disconnected. The sender 12 has a built in power supply 50, such as a battery, so that the sender 12 functions even if the plug 24 has no voltage. For example, if the fuse 44 is connected to the plug 24 and the fuse 44 is disconnected to cut off the current to the plug 24, the sender 12 may still send information to the receiver 14.

A fourth important function is that the system 10 may also be used to test and make sure that residual current detectors 51 are functioning properly and that the detectors turn off the electricity within a permitted time period such as 200 milliseconds or any other time limit. The system 10 may also be used to determine which particular residual current detector 51 that is connected to the plug 24 by analyzing the phases, as outlined above. To test the functionality of the residual current detector, the sender 12 may apply a very small controlled faulty current between the phase and the ground, but not the zero-reference wire, of the plug, and the receiver 14 measures the time it takes until the detector 51 releases. The receiver 14 may transmit a trigger signal 47 to the sender 12 to apply the current at the source plug 24 and the time it takes before the residual current detector 51 is released is measured.

Figure 2:
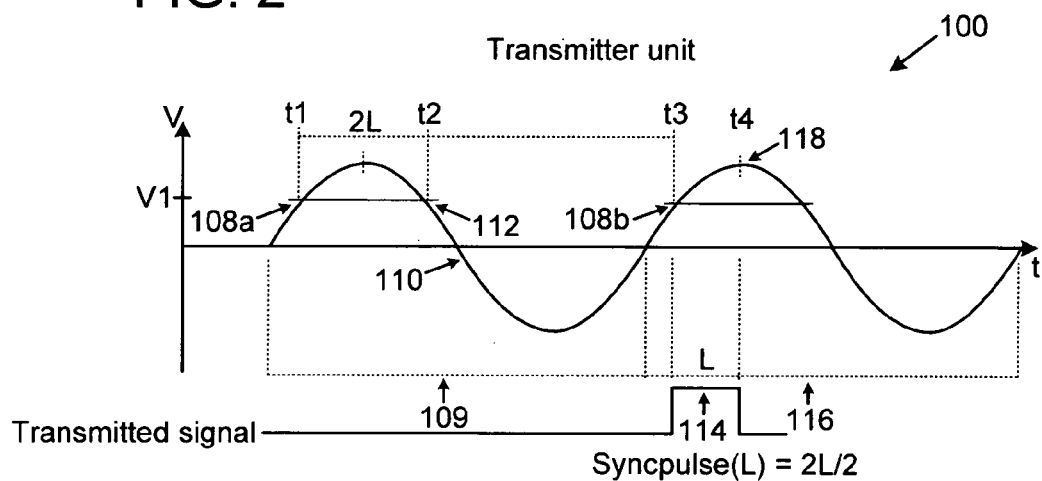
FIG. 2 is a schematic view of a reference phase voltage and synchronization signal at a transmitter unit.

The determination of a reference voltage value in a system 100 is described in more detail below and shown in FIG. 2. In the following case it is assumed that the voltages that are tested are sinusoidal or near sinusoidal. The principles of the present invention will however work with any curve form that is periodical and with a basic frequency in the range for which the system is designed, assuming the different phases have similar waveforms.

A reference time, that may represent the time for reaching a peak value or any reference voltage value, may be calculated by starting a counter from the time it takes from the first time (t1) at the voltage level 108a of a reference phase voltage 110 (while in positive slope) until a time (t2) is reached of the same reference phase voltage (V1) at a second voltage level 112, that is identical to the voltage level 108a, is reached again (while in negative slope) and the counter stops. In other words, the counter counts while the reference phase voltage is greater than the reference phase voltage at the first voltage level 108. It is then assumed that the reference value (i.e. peak value of a sinusoidal curve) is in the middle of the first time (t1) at the voltage level 108 and the second time (t2) at the second voltage level 112. The time difference between the first time (t1) and the second time (t2) has the total length (2L). A length (L) of the synchronization pulse 114 is then adjusted and determined so that it is half of the time difference between the first time (t1) and second time (t2).

The synchronization pulse 114 is sent at the voltage level 108b at a third time (t3) of a second cycle 116 and the length (L) of the pulse 114 is half of the time between the first time (t1) and second time (t2). In this way, the synchronization pulse ends at a fourth time (t4) at a reference point or peak 118 of the reference phase voltage 110.

The determination of the corresponding reference point, i.e. peak value in time, that represents the corresponding reference point or peak value 120 of an unknown phase voltage 122 is carried out in a similar way. As an illustrative example, the peak value 120 is selected as the reference point although another reference point on the unknown phase voltage 122 and the reference phase voltage 110 may be selected.

Figure 3:
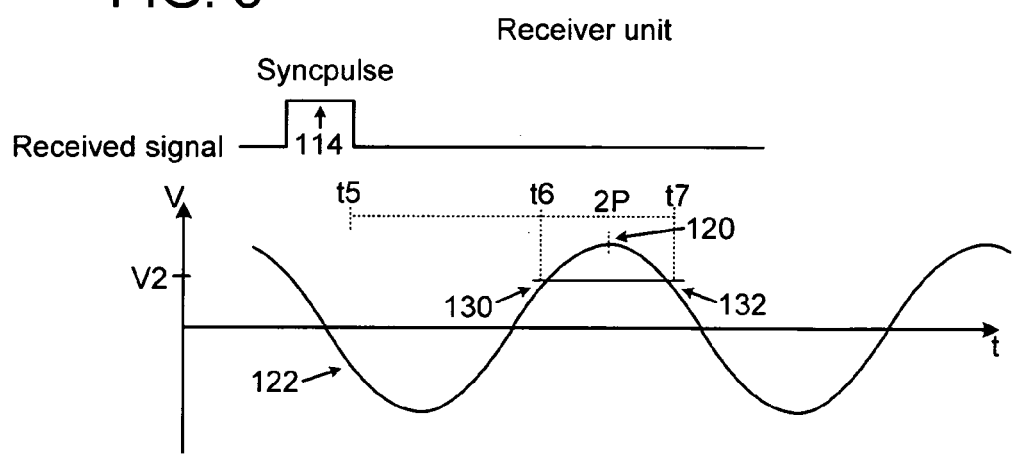
FIG. 3 is a schematic view of an unknown phase voltage at a receiver unit and the synchronization signal received from the transmitter unit.

As best shown in FIG. 3, the time to the reference value (i.e. the peak value of a sinusoidal curve) of the unknown phase 122 may be calculated by starting a counter at the termination of the synchronization pulse at a fifth time (t5). The fifth time (t5) may represent the time of a reference point, such as the peak value at the time (t4) or a later time of a subsequent peak value, of the periodical reference phase voltage 110. A time (t6) is read at the voltage level 130 of the unknown phase 122 (while in positive slope) until a subsequent time (t7) is reached of the same reference phase voltage (V2) at a second voltage level 132, that is identical to the voltage level 130, is reached again (while in negative slope) and the counter stops. The counter counts while the voltage of the unknown phase 122 is greater than the reference phase voltage at the voltage level 132. It is then again assumed that the reference value (i.e. the peak value of a sinusoidal unknown phase curve) is in the middle of the time (t6) at the voltage level 130 and the time (t7) at the second voltage level 132.

The time difference between the time t6 and the time t7 is 2P. The time from termination of the synchronization pulse at the time (t5) and the mean value of the time between the time (t6) and the time (t7) is then calculated to determine the phase difference between the reference voltage phase 110 and the unknown voltage phase 122.

While the present invention has been described in accordance with preferred compositions and embodiments, it is to be understood that certain substitutions and alterations may be made thereto without departing from the spirit and scope of the following claims.

The invention claimed is:

1. A method for testing an electrical component, comprising:
providing a sender unit having a sensor;
applying the sender unit to an electrical plug, the plug having a first line, a second line and a ground line;
determining if the first line, the second line or the ground line has a voltage potential relative to the surrounding;
connecting the sender unit to a remote receiver unit;
determining a phase configuration of the electrical plug;
applying the receiver unit to a remote electrical unit having a voltage to be measured;
determining a length of time between a first time (t1) at a first voltage level and a second time (t2) at a second voltage level of the reference voltage phase, the second voltage level being identical to the first voltage level;
calculating a reference point of the reference voltage phase between the first time (t1) and the second time (t2) based on a length of time between the first time (t1) and the second time (t2);
adjusting a length of a synchronization signal so that the synchronization signal terminates at the calculated peak value of the reference voltage phase;
sending the synchronization signal at a second subsequent cycle of the reference voltage phase when the reference voltage phase reaches the first voltage level at a third time (t3);
determining a length of time between a termination of the first synchronization signal at a time (t5) and a time of a reference point of an unknown voltage phase, as sensed by the receiver unit,
a time (t6) at a first voltage level of the unknown voltage phase and a time (t7) at a second voltage level of the unknown voltage phase identical to the first voltage level of the unknown voltage phase, time of the reference point of the unknown voltage phase being calculated based on a length of time between the time (t6) and the time (t7);
comparing a time difference between the termination of the synchronization signal at the time (t5), corresponding to the reference point of the reference phase voltage, with the time of the reference point of the unknown phase voltage; and
determining the phase relationship between the reference phase voltage and the unknown phase voltage based on the time difference between the time of the reference point of the unknown phase voltage and the time (t5).

2. The method according to claim 1 wherein the method further comprises displaying the phase relationship between the reference voltage at the sender with the unknown voltage at the receiver, on the display of the receiver.

3. The method according to claim 1 wherein the method further comprises the sender unit applying an alternating current, with a predetermined frequency or other signature, at the plug.

4. The method according to claim 3 wherein the method further comprises applying a probe adjacent to a remote electrical unit.

5. The method according to claim 4 wherein the method further comprises providing the probe with a sensor for sensing magnetic field about the remote electrical unit.

6. The method according to claim 5 wherein the method further comprises analyzing the probe signal, based on the properties of the applied alternating current at the sender to determine a level of current generated by the sender that is conducted through the remote electrical unit.

7. The method according to claim 6 wherein the method further comprises determining whether the remote electrical unit is connected to the same electrical phase, in a multiple phase system, as the sender.

8. The method according to claim 7 wherein the method further comprises displaying which remote electrical unit of a multiple of remote electrical units that has the maximum current value resulting from the current generated by the sender.

9. The method according to claim 8 wherein the method further comprises determining which remote electrical unit of a multiple of similar remote electrical units that is connected to the plug.

10. The method according to claim 9 wherein the method further comprises the receiver unit transmitting a trigger signal to the sender to apply a current at the plug.

11. The method according to claim 10 wherein the method further comprises measuring a time period until a residual current detector is released.

* * * * *